(12) United States Patent
Leu et al.

(10) Patent No.: US 8,835,215 B2
(45) Date of Patent: Sep. 16, 2014

(54) METHOD FOR FORMING SUPERIOR LOCAL CONDUCTIVITY IN SELF-ORGANIZED NANODOTS OF TRANSPARENT CONDUCTIVE FILM BY FEMTOSECOND LASER

(75) Inventors: Jih-perng Leu, Taipei (TW); Chih-Wei Luo, Hsinchu (TW); Chih Wang, Taichung (TW); Jwo-Huei Jou, Taipei (TW)

(73) Assignee: National Tsing Hua University, Hsinchu (TW)

( * ) Notice: Subject to any disclaimer, the term of this patent is extended or adjusted under 35 U.S.C. 154(b) by 308 days.

(21) Appl. No.: 13/563,715

(22) Filed: Jul. 31, 2012

(65) Prior Publication Data

US 2013/0299466 A1   Nov. 14, 2013

(30) Foreign Application Priority Data

May 14, 2012 (TW) .................. 101117069

(51) Int. Cl.
*B82Y 30/00* (2011.01)
*B82Y 40/00* (2011.01)
*H01L 33/42* (2010.01)

(52) U.S. Cl.
CPC .............. *B82Y 30/00* (2013.01); *H01L 33/42* (2013.01); *B82Y 40/00* (2013.01); *Y10S 977/84* (2013.01); *Y10S 977/888* (2013.01); *Y10S 977/889* (2013.01); *Y10S 977/901* (2013.01)
USPC ........ 438/104; 438/609; 430/270.1; 430/311; 977/840; 977/888; 977/889; 977/901

(58) Field of Classification Search
CPC ........ H01L 29/00; H01L 33/00; B23K 26/00; B82Y 30/00; B82Y 40/00

USPC .............. 438/104, 478, 609; 430/269, 270.1, 430/311; 977/840, 888, 889, 901; 445/24; 216/63; 505/230; 219/121.6, 121.85
See application file for complete search history.

(56) References Cited

U.S. PATENT DOCUMENTS 5,163,220 A   11/1992 Zeto et al.
7,006,747 B2 *   2/2006 Escuti et al. .................. 385/132
(Continued)

OTHER PUBLICATIONS

Zhao, et al. "Formation of subwavelength periodic structures on tungsten induced by ultrashort laser pulses", International Journal of Optics Letters, vol. 32, No. 13, p. 1932-1934, Jul. 1, 2007.

(Continued)

*Primary Examiner* — Samuel M Heinrich (57) ABSTRACT

A simple method is developed in the present invention for fabricating periodic ripple microstructures on the surface of an ITO film by using single-beam femtosecond laser pulses. The periodic ripple microstructures composed of self-organized nanodots can be directly fabricated through the irradiation of the femtosecond laser, without scanning. The ripple spacing of ~800 nm, ~400 nm and ~200 nm observed in the periodic ripple microstructures can be attributed to the interference between the incident light and the scattering light of the femtosecond laser from the surface of the ITO film. In the present invention, the self-organized dots are formed by the constructive interference formed in the surface of the ITO film, where includes higher energy to break the In—O and Sn—O bonds and then form the In—In bonds. Therefore, the dots have higher surface current greater than other disconstructive regions of the ITO film.

10 Claims, 7 Drawing Sheets

1

(56) References Cited

U.S. PATENT DOCUMENTS

| | | | |
|---|---|---|---|
| 7,438,824 B2 | 10/2008 | Taylor et al. | |
| 7,655,544 B2* | 2/2010 | Yang | 438/479 |
| 7,687,349 B2 | 3/2010 | Coppard et al. | |
| 7,838,851 B2* | 11/2010 | Chen et al. | 250/492.23 |
| 8,367,462 B2* | 2/2013 | Wang et al. | 438/104 |
| 2013/0182445 A1* | 7/2013 | Loicq et al. | 362/311.02 |

OTHER PUBLICATIONS

Borowiec, et al. "Subwavelength ripple formation on the surfaces of compound semiconductors irradiated with femtosecond laser pulses", Applied Physics Letters, vol. 82, No. 25, p. 4462-4464, Jun. 23, 2003.

Shimotsuma, et al. "Self-Organized Nanogratings in Glass Irradiated by Ultrashort Light Pulses", International Journal of Physical Review Letters, vol. 91, No. 24, p. 247405-1:4, Dec. 2003.

Jia, et al. "Optical absorption of two dimensional periodic microstructures on ZnO crystal fabricated by the interference of two femtosecond laser beams", Optics Express paper of vol. 18, No. 14, p. 14401-14408, Jun. 21, 2010.

* cited by examiner

METHOD FOR FORMING SUPERIOR LOCAL CONDUCTIVITY IN SELF-ORGANIZED NANODOTS OF TRANSPARENT CONDUCTIVE FILM BY FEMTOSECOND LASER

BACKGROUND OF THE INVENTION

1. Technical Field

The present invention proposes a simple and rapid method for fabricating metallic self-organized nanodots on the surface of a transparent conductive oxide (TCO), so as to effectively increase the local conductivity of the TCO.

2. Description of Related Art

Indium Tin Oxide (ITO) film is a kind of transparent conductive oxide (TCO) film and plays an important role in Flat Panel displays, such as organic electro-luminescence display (OLED), plasma display panel (PDP), liquid crystal display (LCD), and light emitting diode (LED) display.

Through previous researches and studies, it is able to know that the amorphous ITO film fabricated by sputtering process includes lower surface roughness and higher surface resistance, and performs bad surface current due to the lower surface roughness and higher surface resistance. Accordingly, U.S. Pat. No. 5,163,220 proposes a superstring technique to deposit Ag and Ti films on an ITO film, wherein the Ag and Ti films are taken as metal bus bars for increasing the conductivity of the ITO film, so as to further increase the efficiency of the thin film electroluminescent (TFEL) display using the ITO film as the substrate thereof. Beside the sputtering technique proposed by U.S. Pat. No. 5,163,220, U.S. Pat. No. 7,687,349 forms metallic nanodots on the surface of a dielectric material (i.e., ITO film) by using two processes of: (1) reacting a silicon-containing gas precursor (e.g., silane) to form silicon nuclei over a dielectric film layer; and (2) using a metal precursor to form metallic nanodots where the metallic nanodots use the silicon nuclei from step (1) as nucleation points. Thus, by way of the forming of those metallic nanodots, the surface current of the dielectric film layer is effectively increased.

Differing from the above-mentioned techniques proposed by U.S. Pat. Nos. 5,163,220 and 7,687,349, femtosecond laser surface nanostructuring technique is recently applied in increasing the value added of some materials, such as metal, semiconductor and glass. In the paper published in the international Journal of *OPTICS LETTERS*, vol. 32, No. 13, p. 1932, 2007, the femtosecond laser pulse is used and focused on a region with few microns size on the surface of a tungsten film, and then linear sub-wavelength periodic nanodots are fabricated and formed on the surface of the tungsten film. In addition, the paper published in *APPLIED PHYSICS LETTERS*, Vol. 82, No. 25, p. 4462, 2003 proposes how to fabricate the similar sub-wavelength periodic nanodots on the surface of various compound semiconductors by using the femtosecond laser pulse. Moreover, in the paper published in the international Journal of *PHYSICAL REVIEW LETTERS*, Vol. 91, No. 24, p. 247405-1, 2003, it focuses the single-beam femtosecond laser pulse to the surface of a glass for fabricating some periodic microstructures with the size of 1 µm×1 µm and the spacing of 20 nm. Besides, U.S. Pat. No. 7,438,824 also utilizes and focuses the femtosecond laser pulse to the surface of a transparent or a translucent dielectric material for fabricating periodic microstructures with the assisting of a scanning platform.

Moreover, *OPTICS EXPRESS* paper of Vol. 18, No. 14, p. 14401, 2010 proposes the optical absorption of two dimensional periodic microstructures on ZnO crystal fabricated by the interference of two femtosecond laser beams. However, the same to the technique of U.S. Pat. No. 7,438,824, the femtosecond laser technique of this *OPTICS EXPRESS* paper also uses the scanning platform for carrying out the large area fabrication of the periodic microstructures on the surface of ZnO film.

Accordingly, in view of the above-mentioned conventional femtosecond laser techniques, the person skilled in the related art can find that the conventional femtosecond laser techniques include the shortcomings and drawbacks as follows:
1. Those conventional femtosecond laser techniques all utilize high fluences (0.1-0.4 J/cm$^2$) with a focused spot of hundred micrometers on the surface of semiconductor and dielectric materials, owing to the pulse broadening after an objective lens. However, this way still needs the assisting of a scanning platform in order to fabricate large size periodic microstructure on the surface of the dielectric material.
2. The periodic microstructures made by using those conventional femtosecond laser techniques are all line patterns rather than nanodots array.

Accordingly, in view of the conventional femtosecond laser techniques still have shortcomings and drawbacks, the inventor of the present application has made great efforts to make inventive research thereon and eventually provided a method for forming superior local conductivity in self-organized nanodots on transparent conductive film induced by femtosecond laser pulses.

BRIEF SUMMARY OF THE INVENTION

The primary objective of the present invention is to provide a simple and rapid method, i.e., a method for forming superior local conductivity in self-organized nanodots on transparent conductive film induced by femtosecond laser pulse; in which the periodic ripple microstructures composed of self-organized nanodots can be directly fabricated on the surface of a transparent conductive oxide through the irradiation of the low-fluence femtosecond laser, without scanning; So that the method of the present invention includes the advantage of low equipment cost; moreover, to fabricate the metallic nanodots on the surface of the transparent conductive oxide is helpful to effectively increase the efficiency of OLED device and LED device.

Accordingly, to achieve the above objectives of the present invention, the inventors propose a method for forming superior local conductivity in self-organized nanodots on transparent conductive film induced by femtosecond laser pulse, comprising:

(1) a laser-emitting crystal emits a femtosecond laser pulse by a specific pulse number, wherein the femtosecond laser pulse has a specific pulse duration, a specific wavelength and a specific repetition rate;

(2) amplifying the femtosecond laser pulse by an amplifier for making the femtosecond laser pulse with a specific pulse energy;

(3) facilitating the femtosecond laser pulse hit the surface of an off-axis parabolic mirror;

(4) the off-axis parabolic mirror reflects the femtosecond laser pulses and maintains their pulse width in several ten fs at the position of sample. Then, the femtosecond laser pulses hit the surface of a transparent conductive film by a specific incident angle for fully exposing the surface of the transparent conductive film;

(5) a constructive interference pattern is formed on the surface of the transparent conductive film by the femtosecond laser pulse, wherein the high energy of the constructive interference pattern is adequate to break a plurality of metal-oxygen bonds in the transparent conductive film, and then to form a plurality of metal-metal bonds; and (6) a plurality of periodic ripple microstructures composed of self-organized nanodots are formed on the surface of the transparent conductive film.

BRIEF DESCRIPTION OF THE SEVERAL VIEWS OF THE DRAWINGS

The invention as well as a preferred mode of use and advantages thereof will be best understood by referring to the following detailed description of an illustrative embodiment in conjunction with the accompanying drawings, wherein.

DETAILED DESCRIPTION OF THE INVENTION

To more clearly describe a method for forming superior local conductivity in self-organized nanodots on transparent conductive film induced by femtosecond laser pulses according to the present invention, embodiments of the present invention will be described in detail with reference to the attached drawings hereinafter.

Figure 1:
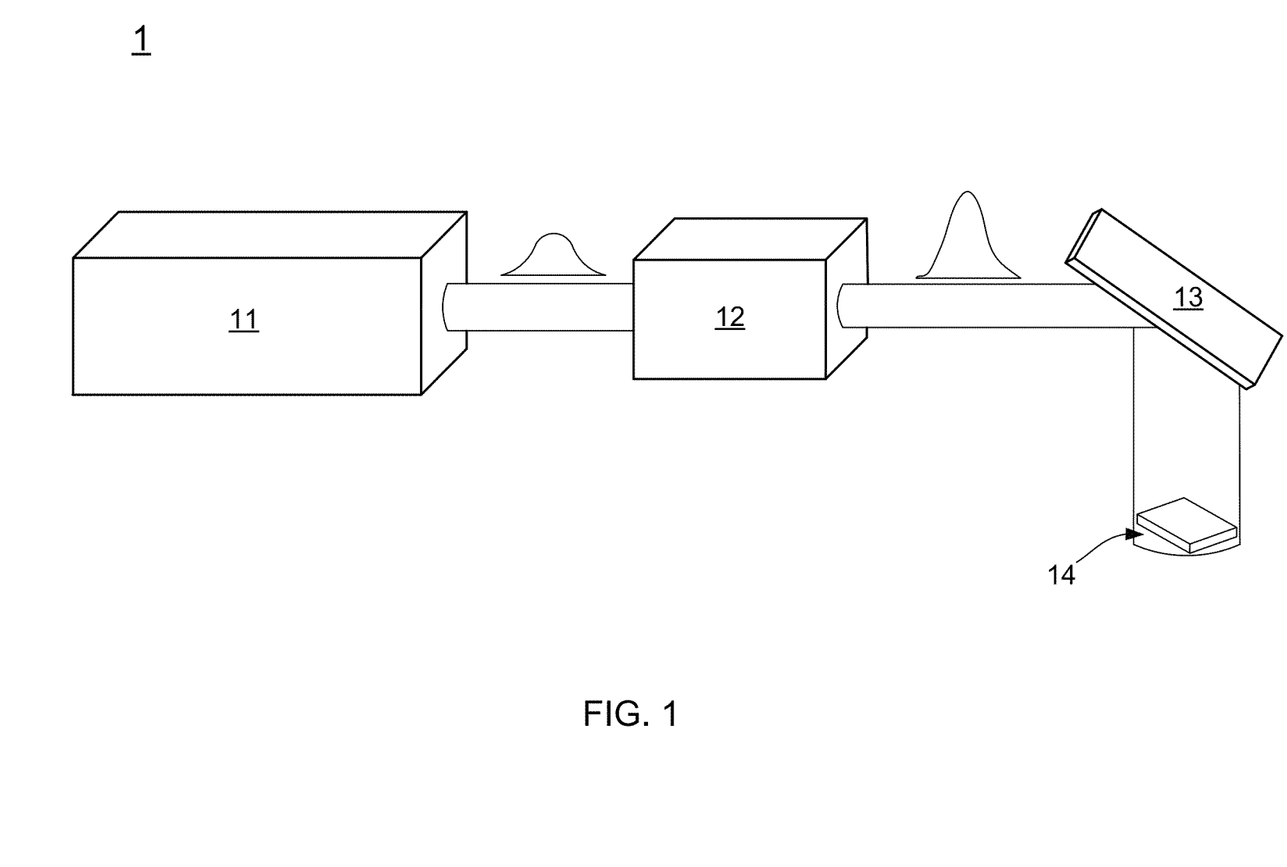
FIG. 1 is a framework view of an emitting system of femtosecond laser pulse.

Before starting to describe the method for forming superior local conductivity in self-organized nanodots on transparent conductive film induced by femtosecond laser pulses, an emitting system of femtosecond laser pulse must be introduced in firstly. Please refer to FIG. 1, which illustrates a framework view of the emitting system of femtosecond laser pulse. As shown in FIG. 1, the emitting system 1 consists of a laser-emitting crystal 11, an amplifier 12 and an off-axis parabolic mirror 13, in which the laser-emitting crystal 11 is a titanium-doped sapphire laser crystal (Ti:sapphire).

Figure 2:
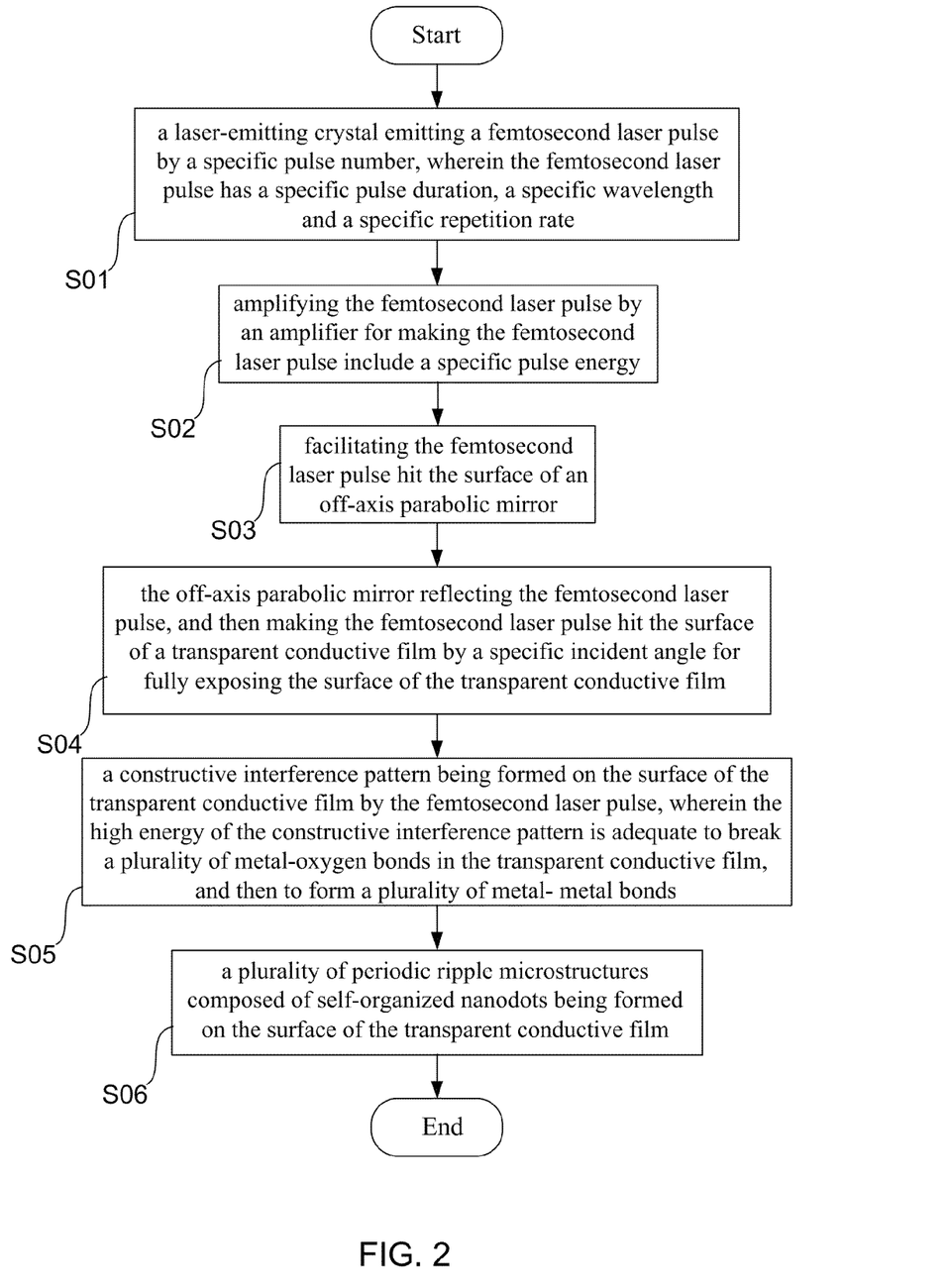
FIG. 2 is a flowchart of a method for forming superior local conductivity in self-organized nanodots on transparent conductive film induced by femtosecond laser pulses.

After introducing the emitting system 1 of femtosecond laser pulse, the method for forming superior local conductivity in self-organized nanodots on transparent conductive film induced by femtosecond laser pulses can next be described. Please refer to FIG. 2, there is shown a flowchart of the method for forming superior local conductivity in self-organized nanodots on transparent conductive film induced by femtosecond laser pulses. As shown in FIG. 1 and FIG. 2, to execute the method, the flow is proceeded to step (S01) for making the laser-emitting crystal 11 emit a femtosecond laser pulse by a specific pulse number, wherein the femtosecond laser pulse has a specific pulse duration of several ten fs, a specific wavelength of 800 nm and a specific repetition rate of 5 kHz. Particularly, in the method of the present invention, the specific pulse number is at least higher than 1000. (The reason for the specific pulse number must being higher than 1000 will be explained through experiment data in following descriptions.)

Next, the flow is proceeded to step (S02) for amplifying the femtosecond laser pulse by the amplifier 12 in order to make the femtosecond laser pulse include a specific pulse energy of 0.1 mJ/cm$^2$. Subsequently, the flow is proceeded to step (S03) and step (S04), in which the femtosecond laser pulse is facilitated to hit the surface of an off-axis parabolic mirror 13 and then reflected by the off-axis parabolic mirror 13, such that the pulse width can be maintained in several ten fs at the position of sample. Then, the laser beam was adjusted to ensure fully exposure for the parent conductive film 14. As shown in FIG. 2, after completing the step (S04), the flow is next proceeded to step (S05) for forming a constructive interference pattern on the surface of the transparent conductive film 14 by the femtosecond laser pulse, wherein the high energy of the constructive interference pattern is adequate to break a plurality of metal-oxygen bonds in the transparent conductive film 14, and then to form a plurality of metal-metal bonds. Eventually, step (S06) is executed in the end of the flow, where a plurality of periodic ripple microstructures composed of self-organized nanodots being formed on the surface of the transparent conductive film 14.

The transparent conductive film 14 mentioned in above step (S04) to step (S06) is an indium-tin-oxide film including a plurality of In—O bonds and Sn—O bonds. In the method of the present invention, the single-beam femtosecond laser pulse is used for breaking the In—O bonds and Sn—O bonds of the indium-tin-oxide film, so as to further form a plurality of In—In bonds in the surface of the indium-tin-oxide film, where the formed In—In bonds constitute the self-organized nanodots of the periodic ripple microstructures. Herein the self-organized nanodots constituted by the In—In bonds have higher surface conductivity greater than the original surface conductivity of ITO film having In—O bonds and Sn—O bonds. Therefore, the surface current of those self-organized nanodots is of course higher than ITO film's.

Figure 3:
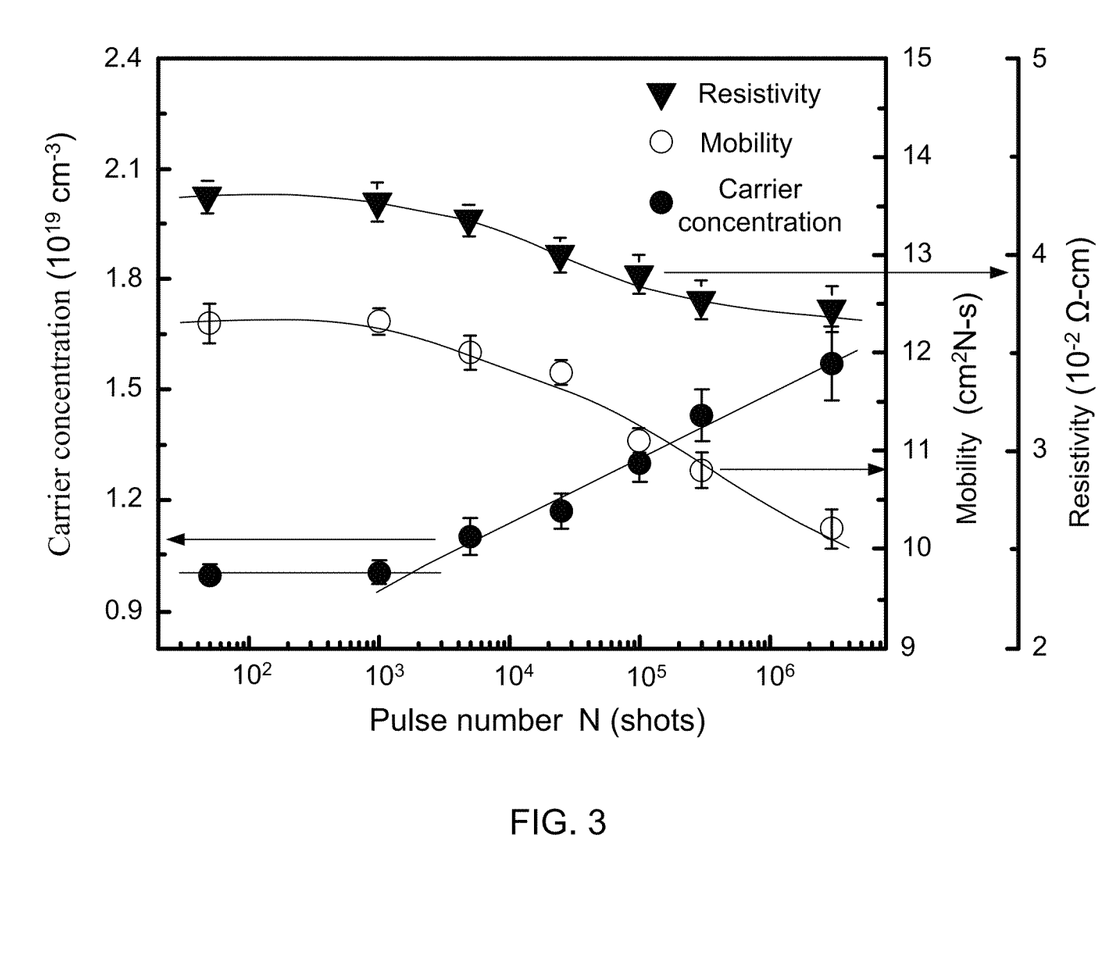
FIG. 3 is curve plots of resistivity, carrier concentration and carrier mobility of an indium-tin-oxide film exposed by femtosecond laser pulses.

Moreover, for proving the method for forming superior local conductivity in self-organized nanodots on transparent conductive film induced by femtosecond laser pulses is practicable, in follows, a variety of experiment data will be presented for proving that. Please refer to FIG. 3, there is three curve plots of resistivity, carrier concentration and carrier mobility of the indium-tin-oxide film exposed by the femtosecond laser pulse, wherein the curve data of FIG. 3 are obtained through Hall measurements. According to the curve data of FIG. 3, it is able to find that the resistivity, carrier concentration and carrier mobility of the indium-tin-oxide film exposed by the femtosecond laser pulse all change with the increase of the pulse number N, where N is a defined symbol rather than an element symbol. As shown in FIG. 3, when N<1000, the changes of the resistivity, carrier concentration and carrier mobility of the indium-tin-oxide film are not obvious; however, when N is set to greater than 1000 and further increased to $3\times10^6$, the carrier concentration rise from $1\times10^{19}$ cm$^{-3}$ to $1.6\times10^{19}$ cm$^{-3}$ linearly, where the increment of the carrier concentration is about 60%. In addition, the carrier mobility of the indium-tin-oxide film relatively descends from 12.3 cm$^2$/V-s to 10.2 cm$^2$/V-s, and the resistivity of the indium-tin-oxide film also relatively descends from $4.3\times10^{-2}$ Ω-cm to $3.7\times10^{-2}$ Ω-cm.

Figure 4:
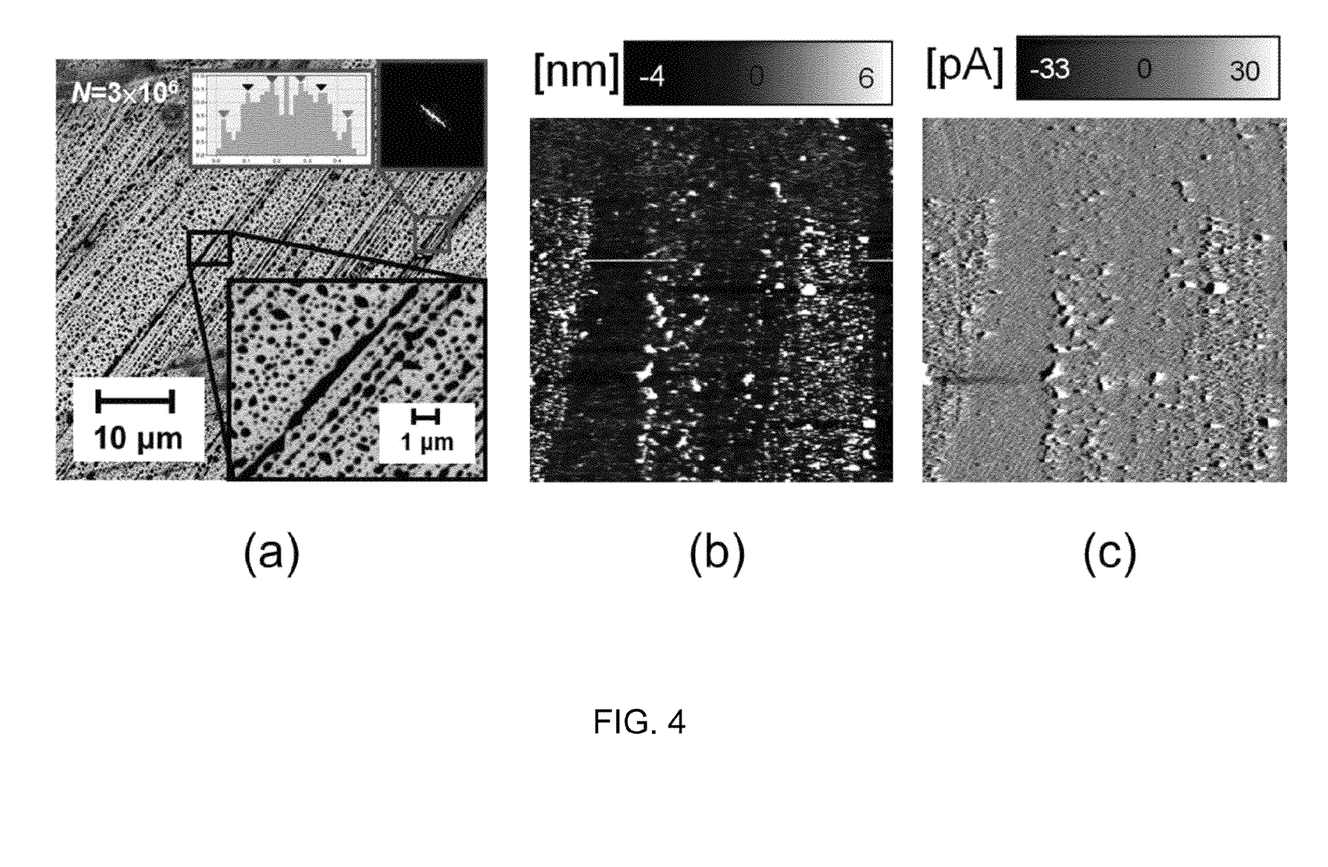
FIG. 4 is an SEM profile image, an AFM profile image and a surface current distribution image of the indium-tin-oxide film exposed by the femtosecond laser pulses.

Continuously referring to FIG. 4, which illustrates an SEM profile image, an AFM profile image and a surface current distribution image of the indium-tin-oxide film exposed by the femtosecond laser pulse, wherein the indium-tin-oxide film in FIG. 4(a) is exposed by the femtosecond laser pulse with pulse energy of 0.1 mJ/cm² and pulse number N of 3×10⁶, and the SEM profile image of the indium-tin-oxide film in FIG. 4(a) is captured by a scanning electron microscope (SEM). Through FIG. 4(a), it is able to find there are three groups of the periodic ripple microstructures being formed on the surface of the ITO film with the ripple spacings of 798±15 nm, 420±14 nm and 230±15 nm, respectively. Besides, the size of the self-organized nanodots of those periodic ripple microstructures is about 20~500 nm. To further explain the three groups of the periodic ripple microstructures via FIG. 5, the ripple spacings between the three periodic ripple microstructures can be determined to ~800 nm, ~400 nm and ~200 nm, respectively.

In addition, the indium-tin-oxide film in FIG. 4(b) is also exposed by the femtosecond laser pulse with pulse energy of 0.1 mJ/cm² and pulse number N of 3×10⁶, and the AFM profile image of the indium-tin-oxide film in FIG. 4(b) is captured by a Atomic Force Microscopy (AFM). Through FIG. 4(b), it can find that the surface roughness of the ITO film is obviously increased to around 4.2 nm, and such surface roughness is hugely greater than the original surface roughness (around 0.4 nm) of the ITO film without being exposed by the femtosecond laser pulse.

Moreover, the indium-tin-oxide film in FIG. 4(c) is also exposed by the femtosecond laser pulse with pulse energy of 0.1 mJ/cm² and pulse number N of 3×10⁶, and the surface current distribution image of the indium-tin-oxide film in FIG. 4(c) is captured by a Current Sensing Atomic Force Microscopy (CSAFM). Through FIG. 4(c), it may find that the surface current of the ITO film is obviously increased to around 10 pA, and such surface current is largely higher than the original surface current (around 0.3 pA) of the ITO film without being exposed by the femtosecond laser pulses. Furthermore, after making a cross-reference between FIG. 4(b) and FIG. 4(c), it can further find that the high surface current distribution region in FIG. 4(c) is extremely related to the nanodots forming region in FIG. 4(b); it means that the nanodots forming region is high surface current distribution region.

Figure 6:
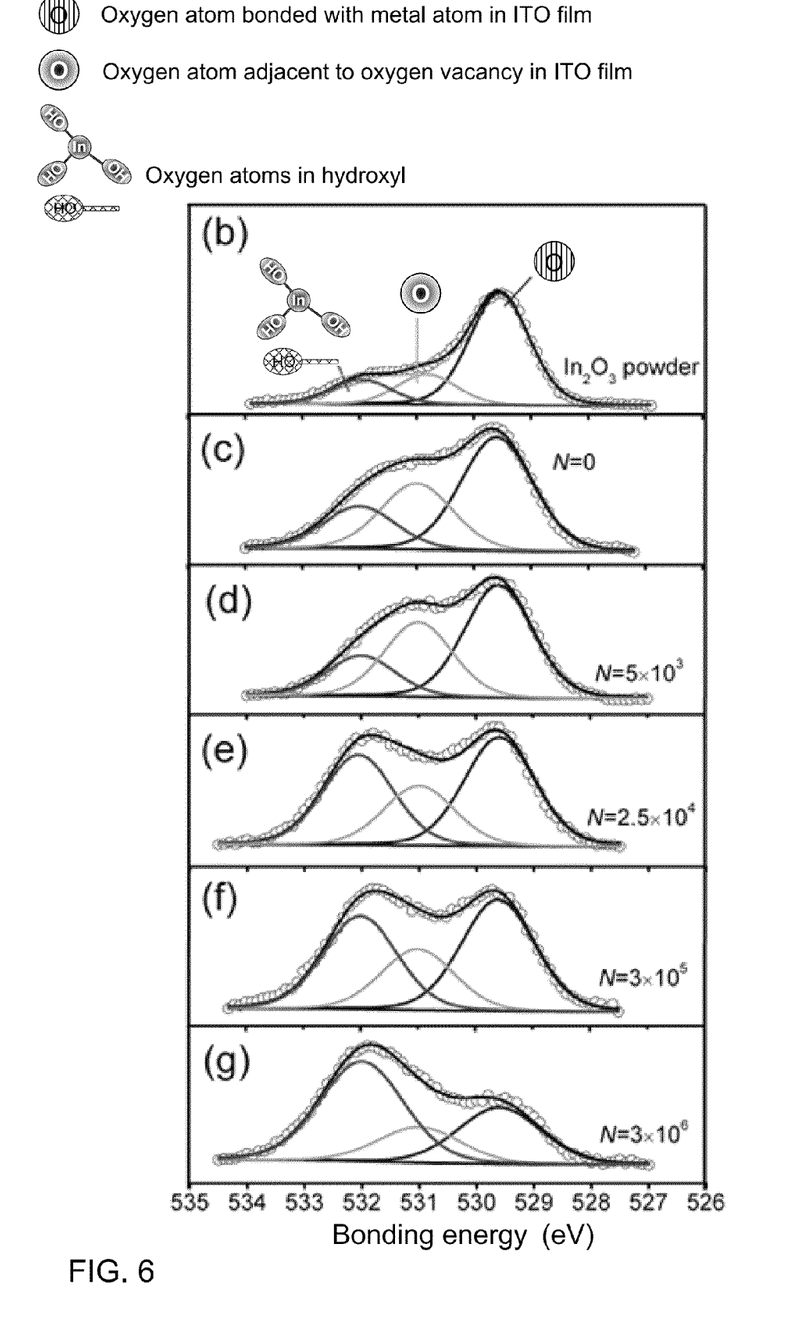
FIG. 6 is an X-ray photoelectron energy spectrum of the indium-tin-oxide film.
Figure 7:
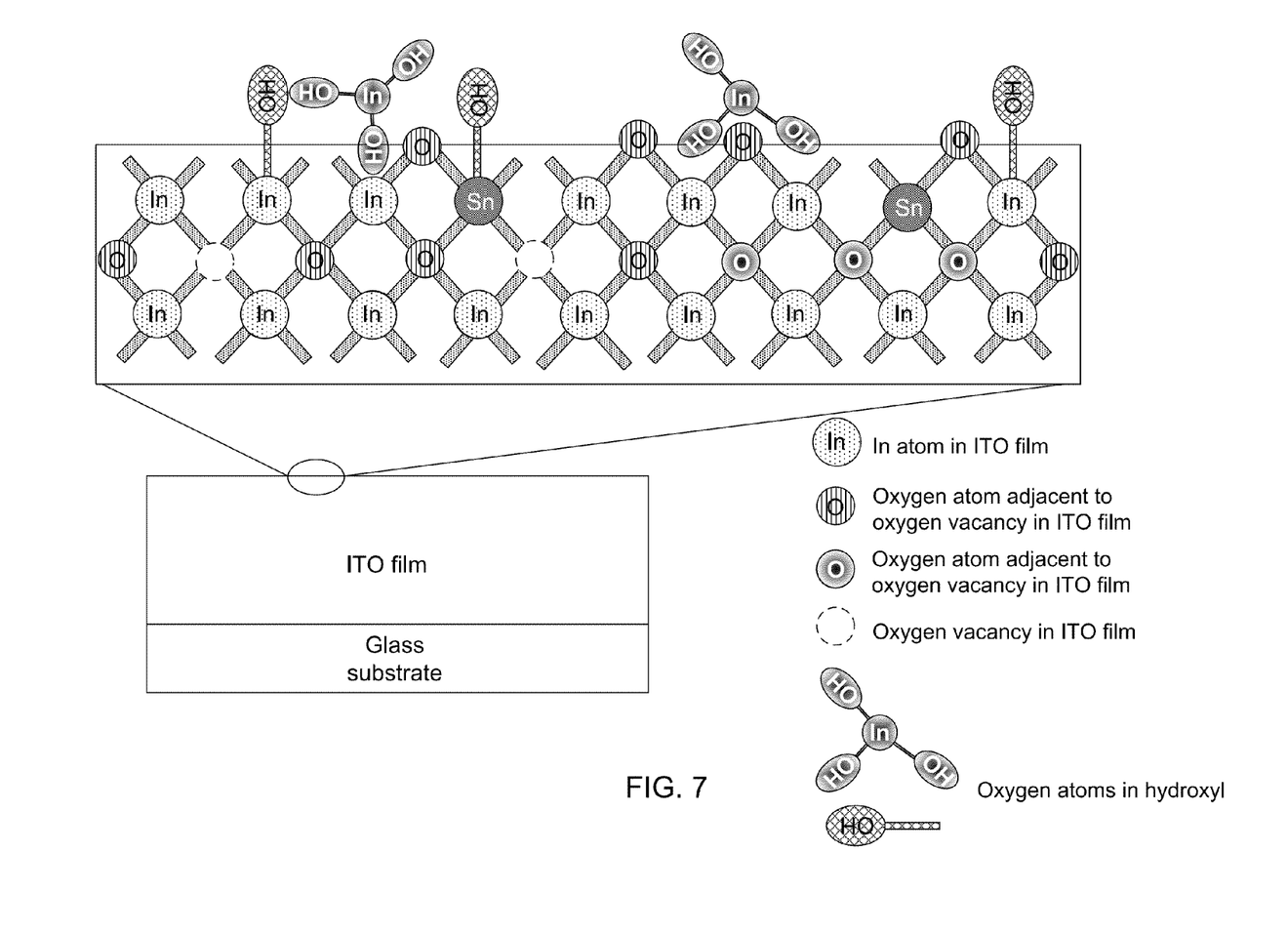
FIG. 7 is a schematic diagram of a surface model of the indium-tin-oxide film irradiated by the femtosecond laser pulse.

Next referring to FIG. 6, there is shown an X-ray photoelectron energy spectrum of the indium-tin-oxide film, wherein the energy spectrum of FIG. 6 is measured by using an X-ray Photoelectron Spectrometer (XPS). Before explaining FIG. 6, the ITO surface model must be introduced firstly. Please refer to FIG. 7, which illustrates a schematic diagram of the surface model of the indium-tin-oxide film. As shown in FIG. 7, ITO film includes many In—O bonds and Sn—O bonds, and also includes some oxygen vacancies.

There are three peaks of oxygen atoms (O1s) in XPS spectrum of FIG. 6, which respectively represents the oxygen atoms bonded with metal atoms in ITO film (the peak is near to bonding energy of 529.6±0.1 eV), the oxygen atoms adjacent to oxygen vacancies in ITO film (the peak is near to bonding energy of 531±0.1 eV), and the oxygen atoms in hydroxyl (the peak is near to bonding energy of 532.6±0.1 eV.). Comparing FIG. 6(b) with FIG. 6(c), it is able to find the value of the spectra energy peak of the oxygen atoms adjacent to oxygen vacancies in the original ITO film is higher than the value of the spectra energy peak of the oxygen atoms adjacent to oxygen vacancies in In₂O₃ powder; it is because that the sputtering deposition of ITO film leads to more increment of the oxygen vacancies in ITO film.

In addition, as shown in FIG. 6(d), FIG. 6(e), FIG. 6(f), and FIG. 6(g), the value of the spectra energy peak of the oxygen atoms bonded with metal atoms in the ITO film exposed by the femtosecond laser pulse decreases with increasing pulse number N; it means that the In—O bonds and Sn—O bonds are broken and the oxygen atoms are released. So that, these released oxygen atoms bond with the metal atoms by hydroxyl type, for example, bonding with In atoms. Therefore, as in FIG. 6(d), FIG. 6(e), FIG. 6(f), and FIG. 6(g), the value of the spectra energy peak of the oxygen atoms in hydroxyl rises with increasing pulse number N.

Figure 5:
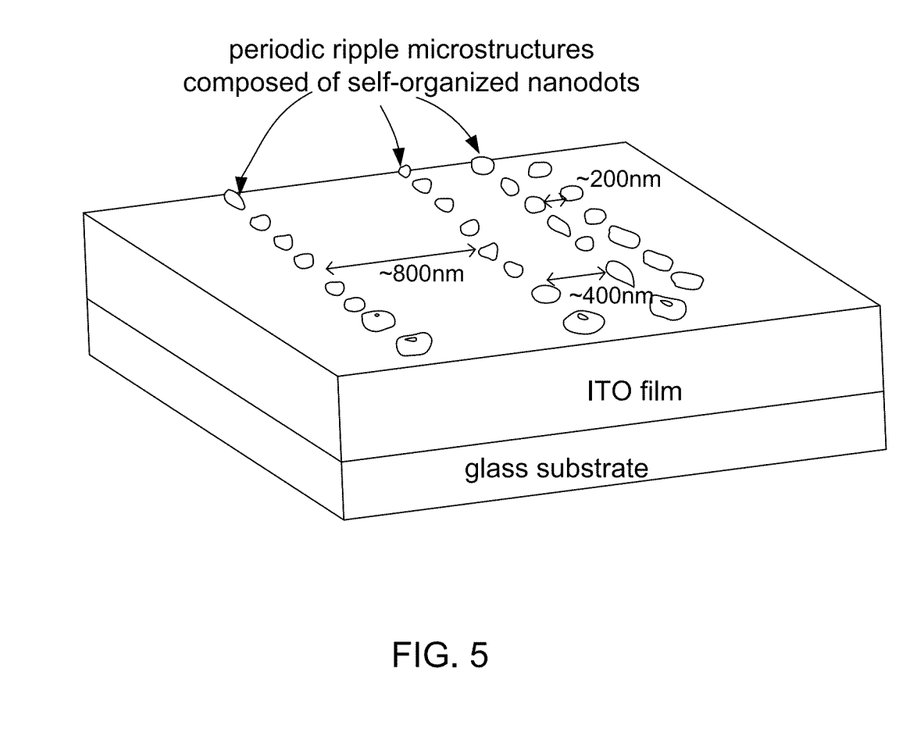
FIG. 5 is a schematic surface profile of the indium-tin-oxide film exposed by the femtosecond laser pulse.

Thus, the practicability of the method for forming superior local conductivity in self-organized nanodots on transparent conductive film induced by femtosecond laser pulses has been proven by above-mentioned experiment data. However, it needs to further explain that the schematic surface profile of the ITO film exposed by the femtosecond laser pulse is made according to FIG. 4(a), where the ripple spacings between the three periodic ripple microstructures in FIG. 5 are determined to ~800 nm, ~400 nm and ~200 nm, respectively, and the determined ripple spacing is also accordant to the principle of scattering model. The formula of the scattering model is defined as $\Lambda=\pi/(1\pm\sin\theta)$, where the $\Lambda$ means the ripple spacing of the periodic ripple microstructures, $\lambda$ means the specific wavelength of the femtosecond laser pulse and the $\theta$ means the specific incident angle of the femtosecond laser pulse. The experiment data proves that the ripple spacings of 800 nm and 400 nm are indeed accordant to the scattering model formula; however, the ripple spacing of 200 nm cannot accordant to the scattering model formula because the ripple spacing of 200 nm is largely small than the wavelength of the femtosecond laser pulse (800 nm). Herein the ripple spacing of 200 nm is regarded as the SHG (second harmonic generation) result of 400 nm short wavelength on ITO film surface.

Therefore, the above descriptions have been clearly and completely introduced the method for forming superior local conductivity in the self-organized nanodots on the transparent conductive film induced by the femtosecond laser pulses of the present invention; moreover, the practicability of the method is also proven by experiment data; in summary, the present invention has the following advantages:

1. Comparing to the conventional superstring technique of depositing Ag and Ti films on an ITO film proposed by U.S. Pat. No. 5,163,220, the method of the present invention merely uses single-beam femtosecond laser pulse to the surface of ITO film for fabricating periodic microstructures composed of self-organized nanodots, without depositing any metal films on the ITO film; And such method can increase 30 folds of surface current of the ITO film.

2. Comparing to the conventional technique of forming metallic nanodots on the surface of a dielectric material (i.e., ITO film) by using two processes proposed by U.S. Pat. No. 7,687,349, the method of the present invention merely uses single-beam femtosecond laser pulse to the surface of ITO film for fabricating periodic microstructures composed of self-organized nanodots, without using any silicon-containing gas precursors; And such method can increase 30 folds of surface current of the ITO film.

3. Comparing to the conventional technique proposed by *OPTICS EXPRESS* paper of Vol. 18, No. 14, p. 14401, 2010, the periodic ripple microstructures composed of self-organized nanodots can be fabricated on the center surface of ITO chip with the size of 200 μm×200 μm, without scanning.

4. Comparing to the conventional technique proposed by the paper published in international Journal of *PHYSICAL REVIEW LETTERS*, Vol. 91, No. 24, p. 247405-1, 2003, the periodic ripple microstructures composed of self-organized nanodots can be fabricated on the center surface of ITO chip with the size of 200 μm×200 μm, without scanning; And those periodic ripple microstructures include the ripple spacings of ~800 nm, ~400 nm and ~200 nm, respectively.

The above description is made on embodiments of the present invention. However, the embodiments are not intended to limit scope of the present invention, and all equivalent implementations or alterations within the spirit of the present invention still fall within the scope of the present invention.

We claim:

1. A method for forming superior local conductivity in self-organized nanodots on transparent conductive film induced by femtosecond laser pulses, comprising the steps of:
   (1) a laser-emitting crystal emitting a femtosecond laser pulse by a specific pulse number, wherein the femtosecond laser pulse has a specific pulse duration, a specific wavelength and a specific repetition rate;
   (2) amplifying the femtosecond laser pulse by an amplifier for making the femtosecond laser pulse with a specific pulse energy;
   (3) facilitating the femtosecond laser pulse hit the surface of an off-axis parabolic mirror;
   (4) the off-axis parabolic mirror reflecting the femtosecond laser pulse, and then making the femtosecond laser pulse hit the surface of a transparent conductive film by a specific incident angle for fully exposing the surface of the transparent conductive film;
   (5) a constructive interference pattern being formed on the surface of the transparent conductive film by the femtosecond laser pulses, wherein the high energy of the constructive interference pattern is adequate to break a plurality of metal-oxygen bonds in the transparent conductive film, and then to form a plurality of metal-metal bonds; and
   (6) a plurality of periodic ripple microstructures composed of self-organized nanodots being formed on the surface of the transparent conductive film.

2. The method for forming superior local conductivity in the self-organized nanodots on the transparent conductive film induced by the femtosecond laser pulses as described in claim 1, wherein the specific repetition rate is ranged from 1 kHz to 5 kHz.

3. The method for forming superior local conductivity in the self-organized nanodots on the transparent conductive film induced by the femtosecond laser pulses as described in claim 1, wherein the specific pulse duration is at least lower than 100 fs and the specific wavelength is 800 nm.

4. The method for forming superior local conductivity in the self-organized nanodots on the transparent conductive film induced by the femtosecond laser pulse as described in claim 1, wherein the specific pulse number is at least higher than 1000.

5. The method for forming superior local conductivity in the self-organized nanodots on the transparent conductive film induced by the femtosecond laser pulses as described in claim 1, wherein the specific pulse energy is at least greater than 0.02 mJ/cm$^2$.

6. The method for forming superior local conductivity in the self-organized nanodots on the transparent conductive film induced by the femtosecond laser pulse as described in claim 1, wherein the transparent conductive film is indium-tin-oxide (ITO) film.

7. The method for forming superior local conductivity in the self-organized nanodots on the transparent conductive film induced by the femtosecond laser pulses as described in claim 6, wherein the metal-oxygen bonds comprises In—O bonds and Sn—O bonds.

8. The method for forming superior local conductivity in the self-organized nanodots on the transparent conductive film induced by the femtosecond laser pulses as described in claim 6, wherein the metal-metal bonds are In—In bonds.

9. The method for forming superior local conductivity in the self-organized nanodots on the transparent conductive film induced by the femtosecond laser pulses as described in claim 1, wherein the period of the periodic ripple microstructures composed of self-organized nanodots is determined by the model of $\Lambda=\lambda/(1\pm\sin\theta)$, where the $\Lambda$ means the ripple spacing of the periodic ripple microstructures, $\lambda$ meaning the specific wavelength of the femtosecond laser pulses and the $\theta$ meaning the specific incident angle of the femtosecond laser pulse.

10. The method for forming superior local conductivity in the self-organized nanodots on the transparent conductive film induced by the femtosecond laser pulses as described in claim 6, wherein the laser-emitting crystal is a titanium-doped sapphire laser crystal (Ti:sapphire).

* * * * *